US011309404B2

(12) United States Patent
Colombeau et al.

(10) Patent No.: US 11,309,404 B2
(45) Date of Patent: Apr. 19, 2022

(54) INTEGRATED CMOS SOURCE DRAIN FORMATION WITH ADVANCED CONTROL

(71) Applicant: Applied Materials, Inc., Santa Clara, CA (US)

(72) Inventors: Benjamin Colombeau, San Jose, CA (US); Tushar Mandrekar, San Jose, CA (US); Patricia M. Liu, Saratoga, CA (US); Suketu Arun Parikh, San Jose, CA (US); Matthias Bauer, Sunnyvale, CA (US); Dimitri R. Kioussis, San Jose, CA (US); Sanjay Natarajan, Portland, OR (US); Abhishek Dube, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 59 days.

(21) Appl. No.: 16/502,555

(22) Filed: Jul. 3, 2019

(65) Prior Publication Data

US 2020/0013878 A1 Jan. 9, 2020

Related U.S. Application Data

(60) Provisional application No. 62/702,645, filed on Jul. 24, 2018, provisional application No. 62/694,424, filed on Jul. 5, 2018.

(51) Int. Cl.
*H01L 21/02* (2006.01)
*H01L 29/66* (2006.01)
(Continued)

(52) U.S. Cl.
CPC .. *H01L 29/66636* (2013.01); *H01L 21/02524* (2013.01); *H01L 21/02532* (2013.01);
(Continued)

(58) Field of Classification Search
CPC ......... H01L 21/02636; H01L 29/66636; H01L 29/7848; H01L 29/66795; H01L 29/785
See application file for complete search history.

(56) References Cited

U.S. PATENT DOCUMENTS 9,853,129 B2  12/2017  Bauer et al.
2005/0085090 A1  4/2005  Mui et al.
(Continued)

FOREIGN PATENT DOCUMENTS

WO    WO-2008105322 A1 *  9/2008  ........ G01M 11/3172

OTHER PUBLICATIONS

PCT International Search Report and Written Opinion in PCT/US2019/040677 dated Oct. 25, 2019, 12 pages.

*Primary Examiner* — Michele Fan
(74) *Attorney, Agent, or Firm* — Servilla Whitney LLC

(57) ABSTRACT

A finFET device includes a doped source and/or drain extension that is disposed between a gate spacer of the finFET and a bulk semiconductor portion of the semiconductor substrate on which the n-doped or p-doped source or drain extension is disposed. The doped source or drain extension is formed by a selective epitaxial growth (SEG) process in a cavity formed proximate the gate spacer. After formation of the cavity, advanced processing controls (APC) (i.e., integrated metrology) is used to determine the distance of recess, without exposing the substrate to an oxidizing environment. The isotropic etch process, the metrology, and selective epitaxial growth may be performed in the same platform.

14 Claims, 16 Drawing Sheets

(51) Int. Cl.
*H01L 21/687* (2006.01)
*H01L 29/78* (2006.01)
*H01L 21/3065* (2006.01)
*H01L 29/06* (2006.01)
*H01L 29/423* (2006.01)
*H01L 29/786* (2006.01)
*H01L 21/67* (2006.01)
*H01L 21/677* (2006.01)
*H01L 29/08* (2006.01)

(52) U.S. Cl.
CPC .. *H01L 21/02576* (2013.01); *H01L 21/02579* (2013.01); *H01L 21/02603* (2013.01); *H01L 21/02636* (2013.01); *H01L 21/3065* (2013.01); *H01L 21/67167* (2013.01); *H01L 21/67196* (2013.01); *H01L 21/67253* (2013.01); *H01L 21/67742* (2013.01); *H01L 21/68707* (2013.01); *H01L 29/0673* (2013.01); *H01L 29/0847* (2013.01); *H01L 29/42392* (2013.01); *H01L 29/66742* (2013.01); *H01L 29/66795* (2013.01); *H01L 29/7848* (2013.01); *H01L 29/7851* (2013.01); *H01L 29/78618* (2013.01); *H01L 29/78696* (2013.01)

(56) References Cited

U.S. PATENT DOCUMENTS

| | | | |
|---|---|---|---|
| 2006/0115949 A1* | 6/2006 | Zhang | H01L 29/7848 438/300 |
| 2006/0148151 A1* | 7/2006 | Murthy | H01L 21/0262 438/197 |
| 2007/0097383 A1 | 5/2007 | Nguyen et al. | |
| 2007/0274810 A1* | 11/2007 | Holtkamp | H01L 21/6719 414/217 |
| 2011/0003450 A1* | 1/2011 | Lee | H01L 29/78 438/285 |
| 2012/0211164 A1 | 8/2012 | Shah et al. | |
| 2013/0024019 A1* | 1/2013 | Wang | G05B 19/41875 700/103 |
| 2013/0214251 A1* | 8/2013 | Balkenende | H01L 33/04 257/13 |
| 2017/0141228 A1* | 5/2017 | Hsu | H01L 27/088 |
| 2017/0330960 A1* | 11/2017 | Bauer | H01L 21/02658 |
| 2018/0069100 A1 | 3/2018 | Bauer et al. | |
| 2018/0076326 A1 | 3/2018 | Roh et al. | |
| 2019/0164767 A1* | 5/2019 | Hong | H01L 21/02178 |

\* cited by examiner

INTEGRATED CMOS SOURCE DRAIN FORMATION WITH ADVANCED CONTROL

CROSS-REFERENCE TO RELATED APPLICATIONS

This application claims priority to U.S. Provisional Application No. 62/694,424, filed Jul. 5, 2018, and U.S. Provisional Application No. 62/702,645, filed Jul. 24, 2018, the entire disclosures of which are hereby incorporated by reference herein.

TECHNICAL FIELD

Embodiments of the present disclosure generally relate to the fabrication of integrated circuits and particularly to an apparatus and method for forming source drain extensions in a finFET using selective epitaxial growth (SEG).

BACKGROUND

The transistor is a key component of most integrated circuits. Since the drive current, and therefore speed, of a transistor is proportional to the gate width of the transistor, faster transistors generally require larger gate width. Thus, there is a trade-off between transistor size and speed, and "fin" field-effect transistors (finFETs) have been developed to address the conflicting goals of a transistor having maximum drive current and minimum size. FinFETs are characterized by a fin-shaped channel region that greatly increases the size of the transistor without significantly increasing the footprint of the transistor, and are now being applied in many integrated circuits. However, finFETs have their own drawbacks.

The formation of horizontal source/drain extensions becomes increasingly difficult for narrow and tall finFETs, since the fin-shaped channel region can be easily amorphized or otherwise damaged by conventional ion implantation techniques, such as beamline ion implant. Specifically, in some finFET architectures (e.g. horizontal Gate-All-Around, h-GAA), ion implantation can cause serious intermixing between the silicon channel and the adjacent silicon-germanium (SiGe) sacrificial layer. Such intermixing is highly undesirable, since the ability to selectively remove the sacrificial SiGe layer is then compromised. In addition, repair of such implant damage via thermal anneal increases the thermal budget of the finFET device.

Additionally, precise placement of a desired dopant in the horizontal source/drain extension region of a finFET is at best very difficult, since the source/drain extension in a finFET can be covered by other structures. For example, an (internal) sidewall spacer on the sacrificial SiGe superlattice (SL) layer typically covers the source/drain extension region at the time that doping is performed. Consequently, conventional line-of-sight ion implantation techniques cannot directly deposit dopants uniformly to the finFET source/drain extension region.

Furthermore, the time that the substrate is exposed to atmosphere (also called Q-time) can have a marked impact on the defectivity of the epitaxial film. Accordingly, there is a need for processing apparatus and techniques for precisely doping source/drain regions in finFET devices that are currently available or are under development.

SUMMARY

One or more embodiments of the disclosure are directed to methods of forming a semiconductor device. An anisotropic etch process is performed on a semiconductor material on a semiconductor substrate to expose a surface in the semiconductor material. The surface is disposed between an existing structure of the semiconductor device and a bulk semiconductor portion of the semiconductor substrate on which the semiconductor material is formed. An isotropic etch process is performed on an exposed sidewall to recess the semiconductor material that is disposed between the existing structure and the bulk semiconductor portion of the semiconductor substrate by a distance to form a cavity. A layer of deposited material is formed via a selective epitaxial growth (SEG) process on a surface of the cavity. The substrate is not subjected to a pre-clean process between formation of the cavity and SEG.

Additional embodiments of the disclosure are directed to methods of forming a semiconductor device. A semiconductor substrate is positioned within a semiconductor material thereon in a first processing chamber. An anisotropic etch process is performed on the semiconductor material to expose a surface in the semiconductor material. The surface is disposed between an existing structure of the semiconductor device and a bulk semiconductor portion of the semiconductor substrate on which the semiconductor material is formed. An isotropic etch process is performed on an exposed sidewall to recess the semiconductor material that is disposed between the existing structure and the bulk semiconductor portion of the semiconductor substrate by a distance to form a cavity. The semiconductor substrate is moved from the first processing chamber to a second processing chamber without exposing the semiconductor substrate to oxidative conditions. A distance that the semiconductor material has been recessed after isotropic etch is determined. A layer of deposited material is formed in the second processing chamber using a selective epitaxial growth (SEG) process on a surface of the cavity. The semiconductor substrate is not subjected to a pre-clean process between formation of the cavity and SEG. The SEG process accounts for the distance that the semiconductor material has been recessed after isotropic etch.

Further embodiments of the disclosure are directed to processing tools for forming a semiconductor device. A central transfer station has a plurality of processing chambers disposed around the central transfer station. A robot is within the central transfer station and is configured to move a substrate between the plurality of processing chambers. A first processing chamber is connected to the central transfer station. The first processing chamber is configured to perform an isotropic etch process. A metrology station is within the processing tool accessible to the robot. The metrology station is configured to determine a distance of recess of semiconductor material on a substrate from the isotropic etch process. A second processing chamber is connected to the central transfer station. The second processing chamber is configured to perform a selective epitaxial growth (SEG) process. A controller is connected to one or more of the central transfer station, the robot, the first processing chamber, the metrology station or the second processing chamber. The controller has one or more configurations selected from: a first configuration to move a substrate on the robot between the plurality of processing chambers and metrology station; a second configuration to perform an isotropic etch process on a substrate in the first processing chamber; a third configuration to perform an analysis to determine the recess of the semiconductor material in the metrology station; or a fourth configuration to perform a selective epitaxial growth process in the second processing chamber, the selective epitaxial growth process adjusted for the recess of the semiconductor material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
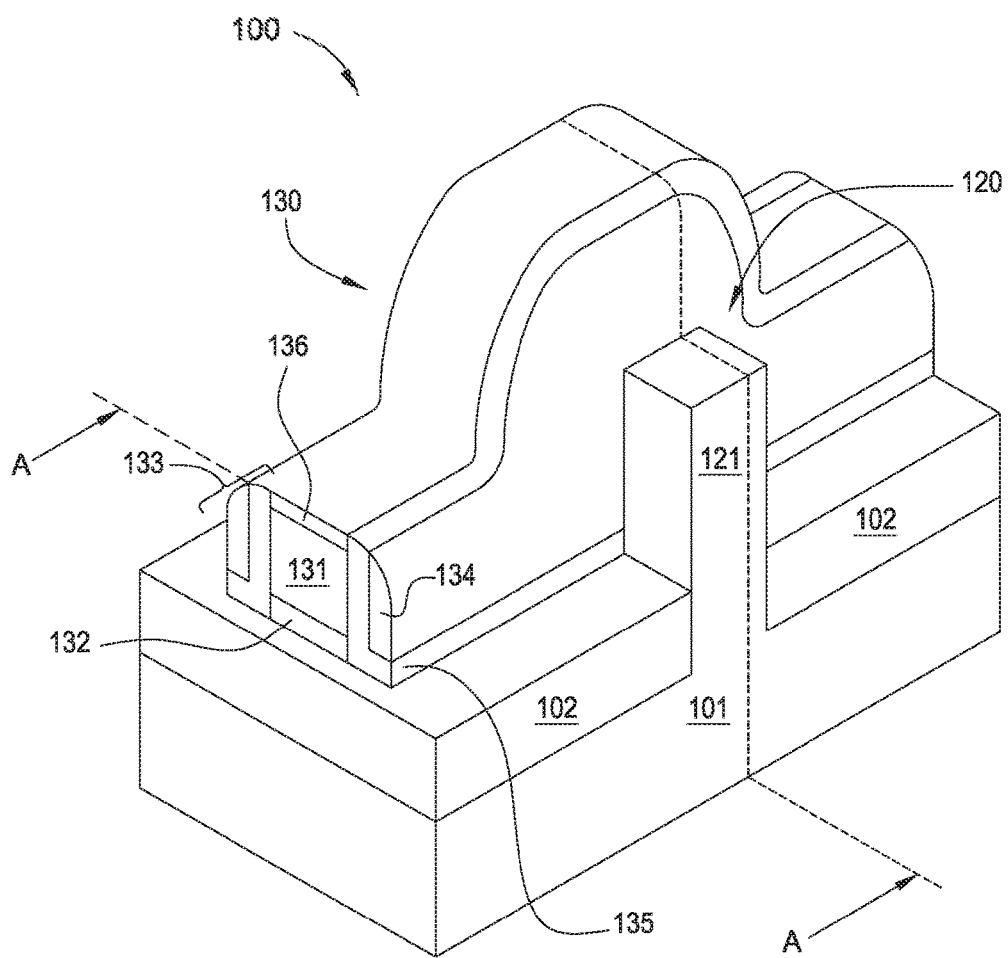
FIG. 1 is a perspective view of a fin-field-effect transistor (finFET), according to one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the present disclosure relate to semiconductor devices, processing tools and processing methods that include a doped semiconductor material that is formed within a region that is disposed between an existing structure of the semiconductor device and a bulk semiconductor portion of the semiconductor substrate. In one or more embodiments, the semiconductor device comprises a finFET device. In such embodiments, the n-doped silicon-containing material forms an n-doped source or drain extension disposed between a gate spacer of the finFET and a bulk semiconductor portion of the semiconductor substrate on which the n-doped source or drain extension is disposed. While embodiments of the disclosure are described with respect to the formation of nMOS (n-type metal oxide semiconductor) and n-doped films, the skilled artisan will recognize that p-doped films can also be formed by an analogous process. References throughout this disclosure to "nMOS" or "n-doped" are merely for ease of description and the disclosure should not be taken as being limited to nMOS or n-doped structures. In some embodiments, the methods are directed to the formation of pMOS (p-type metal oxide semiconductor) or p-doped films. Some embodiments of the disclosure are directed to processes for forming PMOS devices in which the Source/Drain (SD) comprises multiple layers of SiGe and boron. In one or more embodiments, SD materials provide compressive stress for PMOS devices that increase hole mobility. The control of the lateral push amount in the conjunction with epitaxial SD layer formation can affect overall performance.

FIG. 1 is a perspective view of a fin-field-effect transistor (finFET) 100, according to an embodiment of the disclosure. FinFET 100 includes a semiconductor substrate 101, insulation regions 102 formed on a surface of semiconductor substrate 101, a fin structure 120 formed on the surface of semiconductor substrate 101, and a gate electrode structure 130 formed on insulation regions 102 and on fin structure 120. A top portion of fin structure 120 is exposed and electrically coupled to the source contact (not shown) of finFET 100, another top portion of fin structure 120 is exposed and electrically coupled to the drain contact (not shown) of finFET 100, and a center portion of semiconductor fin 121 includes the channel region of finFET 100. Gate electrode structure 130 serves as the gate of finFET 100.

Semiconductor substrate 101 may be a bulk silicon (Si) substrate, a bulk germanium (Ge) substrate, a bulk silicon-germanium (SiGe) substrate, or the like. Insulation regions 102, alternatively referred to as shallow trench isolation (STI), may include one or more dielectric materials, such as silicon dioxide ($SiO_2$), silicon nitride ($Si_3N.sub.4$), or multiple layers thereof. Insulation regions 102 may be formed by high-density plasma (HDP), flowable chemical vapor deposition (FCVD), or the like.

Fin structure 120 includes a semiconductor fin 121 and fin spacers (not shown for clarity) that are formed on sidewalls of semiconductor fin 121. Semiconductor fin 121 may be formed from semiconductor substrate 101 or from a different semiconductor material that is deposited on semiconductor substrate 101. In the latter case, the different semiconductor material may include silicon-germanium, a III-V compound semiconductor material, or the like.

Gate electrode structure 130 includes a gate electrode layer 131, a gate dielectric layer 132, gate spacers 133, and a mask layer 136. In some embodiments, gate electrode layer 131 includes a polysilicon layer or a metal layer that is capped with a polysilicon layer. In other embodiments, gate electrode layer 131 includes a material selected from metal nitrides (such as titanium nitride (TiN), tantalum nitride (TaN) and molybdenum nitride ($MoN_x$)), metal carbides (such as tantalum carbide (TaC) and hafnium carbide (HfC)), metal-nitride-carbides (such as TaCN), metal oxides (such as molybdenum oxide ($MoO_x$)), metal oxynitrides (such as molybdenum oxynitride ($MoO_xN_y$)), metal silicides (such as nickel silicide), and combinations thereof. Gate electrode layer 131 can also be a metal layer capped with a polysilicon layer.

Gate dielectric layer 132 may include silicon oxide ($SiO_x$), which may be formed by a thermal oxidation of semiconductor fin 121. In other embodiments, gate dielectric layer 132 is formed by a deposition process. Suitable materials for forming gate dielectric layer 132 include silicon oxide, silicon nitrides, oxynitrides, metal oxides such as $HfO_2$, $HfZrO_x$, $HfSiO_x$, $HfTiO_x$, $HfAlO_x$, and combinations and multi-layers thereof. Gate spacers 133 are formed on sidewalls of gate electrode layer 131, and each may include a nitride portion 134 and/or an oxide portion 135 as shown. In some embodiments, mask layer 136 may be formed on gate electrode layer 131 as shown, and may include silicon nitride.

Figure 2:
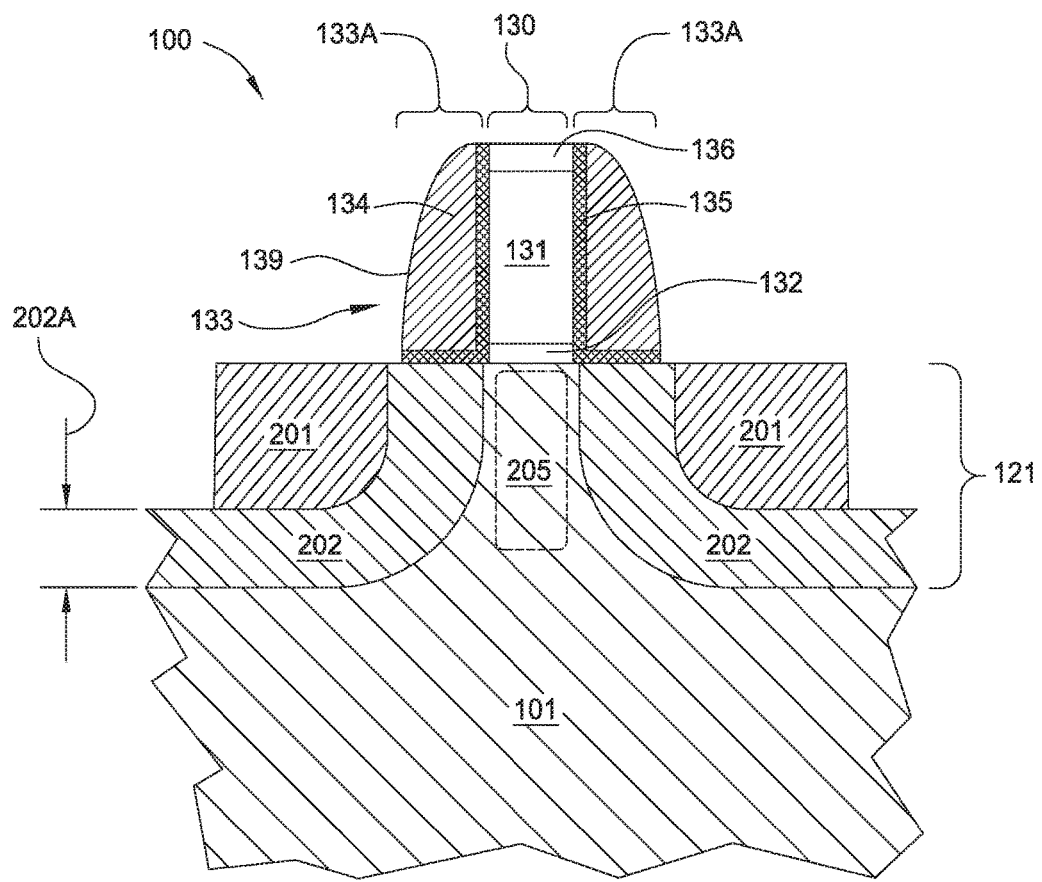
FIG. 2 is a cross-sectional view of the finFET of FIG. 1, according to one or more embodiment of the disclosure.

FIG. 2 is a cross-sectional view of finFET 100, according to an embodiment of the disclosure. The cross-sectional view illustrated in FIG. 2 is taken at section A-A in FIG. 1. As shown, finFET 100 includes semiconductor fin 121 with heavily doped regions 201, doped extension regions 202, and a channel region 205. While the embodiments herein are described with respect to the formation of an nMOS, the skilled artisan will recognize that heavily doped region 201 and doped extension region 202 can be p-doped regions.

Heavily doped regions 201 form the source and drain regions of finFET 100, and include relatively high concentrations of n-dopants (e.g., phosphorus (P), arsenic (As), antimony (Sb), bismuth (Bi), lithium (Li)) or p-dopants (e.g., boron (B), aluminum (Al), gallium (Ga) or indium (In)). While region 201 may be referred to as heavily n-doped, the skilled artisan will recognize that this region can be a p-doped region and can include relatively high concentrations of p-dopants, such as boron (B). For example, in some embodiments, a concentration of dopants in heavily doped regions 201 may be as high as $5 \times 10^{21}$ atoms/$cm^3$. In some embodiments, the heavily doped region 201 has a dopant concentration in the range of about $1 \times 10^{20}$ atoms/$cm^3$ to about $1 \times 10^{22}$ atoms/$cm^3$. Heavily doped regions 201 may be produced by any suitable doping technique. Because heavily doped regions 201 are generally not covered by an intervening structure of finFET 100 at the time of doping, a line-of-sight doping technique, such as beamline ion implantation, may be employed. Alternatively, a conformal doping technique, such as plasma doping (PLAD), may be employed to form heavily doped regions 201, since a significant portion of each heavily doped region 201 is generally exposed at the time of doping.

Doped extension regions 202 form the source and drain extensions of finFET 100, and include one or more n-dopants. The skilled artisan will recognize that the extension region could be a p-doped region. According to embodiments of the disclosure, doped extension regions 202 include one or more n-dopants that act as a diffusion barrier for the n-dopants located in heavily doped regions 201. Thus, because doped extension regions 202 are disposed between channel region 205 and heavily doped regions 201, n-dopants located in heavily doped regions 201, such as phosphorus, cannot diffuse into channel region 205. With the small geometries associated with modern finFET devices, a width 133A of gate spacers 133, which is also approximately the distance between heavily doped regions 201, can be just a few nanometers. Therefore, such n-dopant diffusion can be a serious challenge in nMOS devices, such as finFET 100. In some embodiments, the doped extension regions 202 include one or more heavier mass atoms (e.g, Ge, Sn etc.) that increase compressive stress in the channel region 205.

In some embodiments, the n-dopants located in heavily doped regions 201 may include phosphorus. In such embodiments, the n-dopants included in doped extension regions 202 may include arsenic (As), which can act as a significant diffusion barrier to phosphorus diffusion or simply as a spatial (geometrical) offset. Alternatively or additionally, in such embodiments, the n-dopants included in doped extension regions 202 may include antimony (Sb), which may also act as a partial barrier to phosphorus diffusion. In some embodiments, the p-dopants included in region 201 and region 202 may independently include one or more of boron (B), aluminum (Al), gallium (Ga) or Indium (In).

In some embodiments, doped extension regions 202 are formed with a thickness 202A that is less than width 133A of gate spacers 133. For example, in such embodiments, thickness 202A of doped extension regions 202 may be approximately 1 nanometer less that width 133A. Consequently, in such embodiments, doped extension regions 202 do not extend into channel region 205.

Furthermore, according to embodiments of the disclosure, doped extension regions 202 are formed via a (SEG) process. Specifically, a cavity is formed in a portion of semiconductor fin 121 that is disposed between gate spacers 133 and a bulk semiconductor portion of semiconductor substrate 101. The cavity is then filled with n- or p-doped semiconductor material, such as a silicon material that is doped with arsenic (As) (e.g., also referred to herein as Si:As) or boron (B) (e.g., also referred to herein as Si:B). Thus, source-drain extensions for finFET 100 are formed in a region of semiconductor fin 121 that is between an existing structure of semiconductor fin 121 and a bulk semiconductor portion of semiconductor substrate 101. Furthermore, the n-dopants included in doped extension regions 202 can be selected to act as a diffusion barrier for the n-dopants located in heavily doped regions 201. It is noted that, due to the presence of gate spacers 133, doped extension regions 202 cannot be formed by either beamline ion implantation or PLAD. Various embodiments by which doped extension regions 202 may be formed in finFET 100 are described below in conjunction with FIGS. 3 and 4A-4E.

Figure 3:
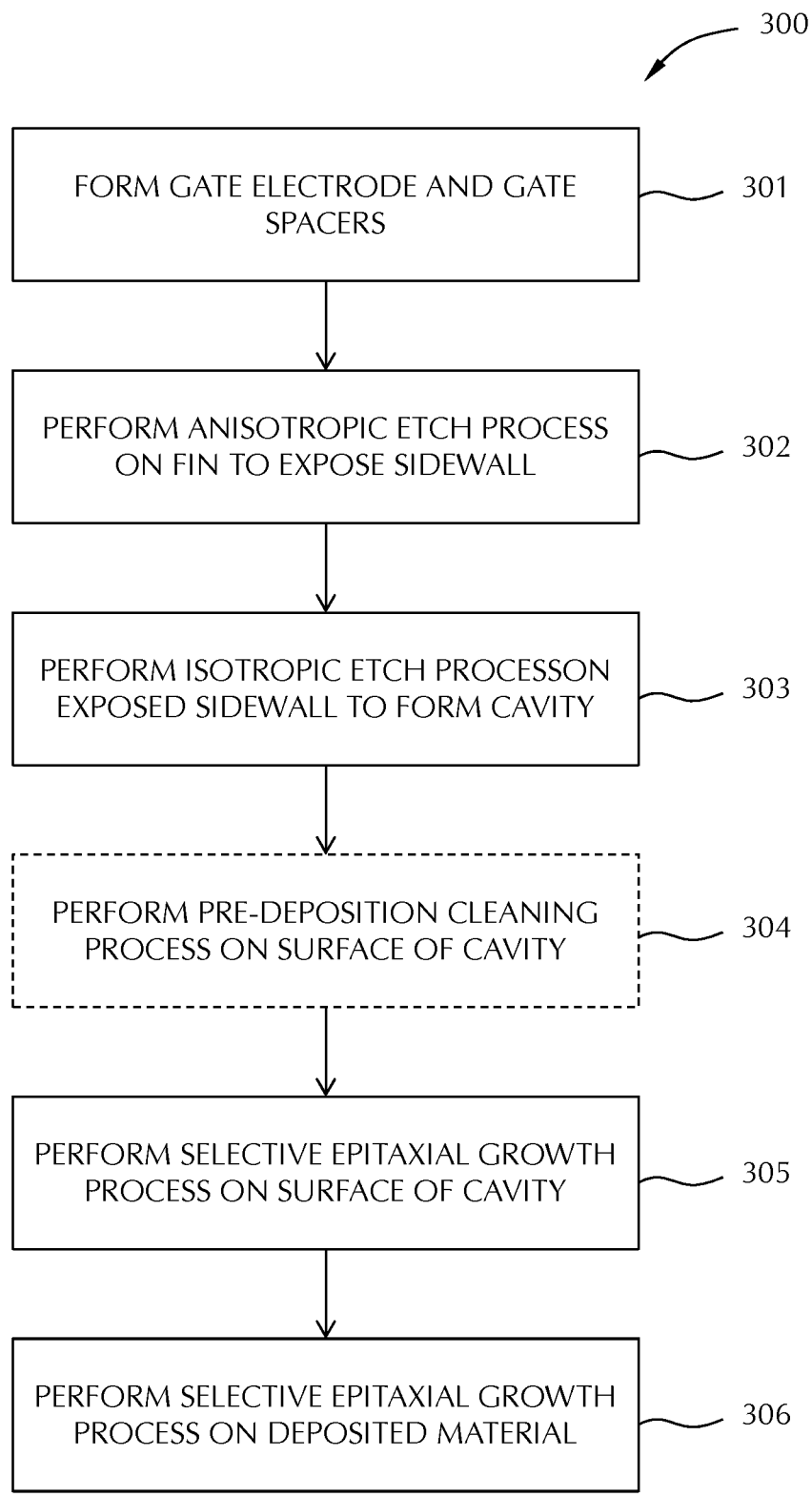
FIG. 3 is a flowchart of a manufacturing process for forming a finFET, according to one or more embodiments of the disclosure.

FIG. 3 is a flowchart of a manufacturing process 300 for forming an nMOS finFET, according to various embodiments of the disclosure. The skilled artisan will recognize that a pMOS finFET can be formed by a similar manufacturing process. FIGS. 4A-4E are schematic cross-sectional views of a semiconductor device corresponding to various stages of process 300, such as finFET 100 in FIG. 1, according to various embodiments of the disclosure. Although process 300 is illustrated for forming an doped extension region, process 300 may be employed to form other structures on a substrate as well.

Figure 4A:
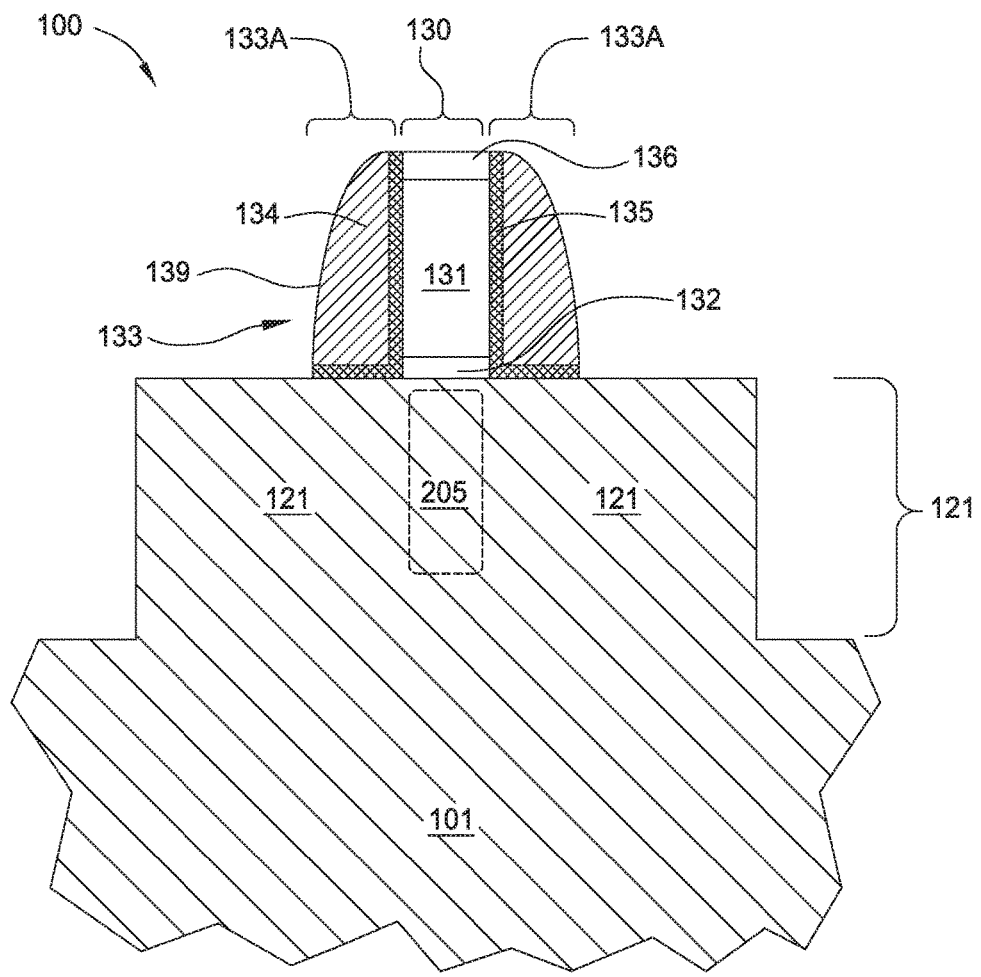
FIGS. 4A-4E show schematic cross-sectional views of a semiconductor device corresponding to various stages of the process of FIG. 3, according to one or more embodiments of the disclosure.

Process 300 begins at operation 301, in which a gate electrode structure 130 and gate spacers 133 are formed on semiconductor fin 121, as shown in FIG. 4A. In the embodiment illustrated in FIG. 4A, semiconductor fin 121 is formed from a portion of semiconductor substrate 101.

Figure 4B:
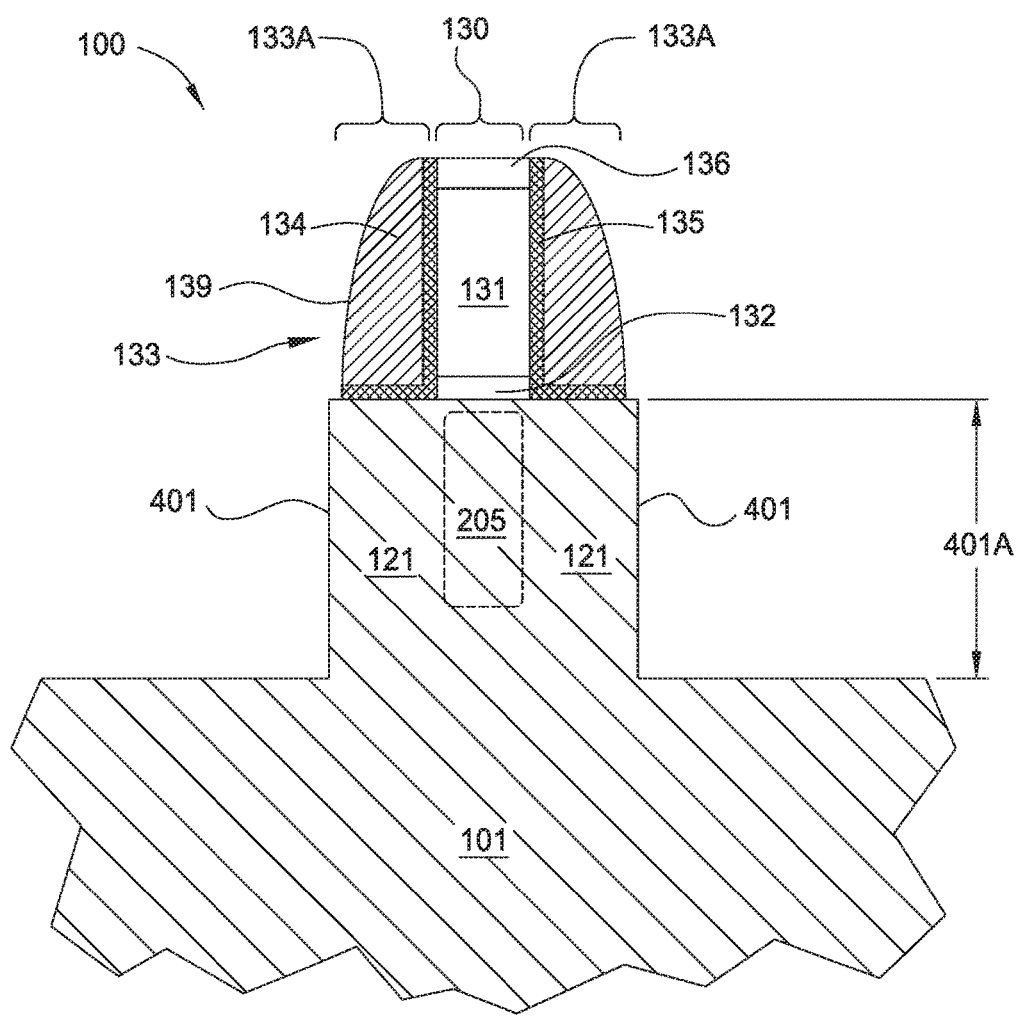

In operation 302, an anisotropic etch process is performed on the portion of semiconductor fin 121 that is disposed between gate spacers 133 and a bulk semiconductor portion of semiconductor substrate 101. As a result, one or more sidewall surfaces 401 in the semiconductor material of semiconductor fin 121 are exposed, as illustrated in FIG. 4B. As shown, sidewall surface 401 is disposed between an existing structure of finFET 100 and a bulk semiconductor portion of semiconductor substrate 101. That is, sidewall surface 401 is disposed between gate spacers 133 and semiconductor substrate 101. Consequently, sidewall surface 401 is in a region of semiconductor fin 121 that is inaccessible to a conventional, surface-normal line-of-sight ion implantation technique.

The anisotropic etch process of operation 302 may be selected to remove sufficient material from semiconductor fin 121 so that sidewall surface 401 has any suitable target length 401A. For example, in some embodiments, the anisotropic etch process of operation 302 is performed so that sidewall surface 401 has a target length 401A of about 5 nm to about 10 nm. In other embodiments, sidewall surface 401 may have a target length 401A of more than 10 nm or less than 5 nm, depending on the geometry of gate spacers 133, the concentration of n-dopants in heavily doped regions 201, the dimensions of channel region 205, and other factors. The anisotropic etch process of operation 302 may be, for example, a deep reactive-ion etch (DRIE) process during which gate spacers 133 and other portions of finFET 100 are masked.

Figure 4C:
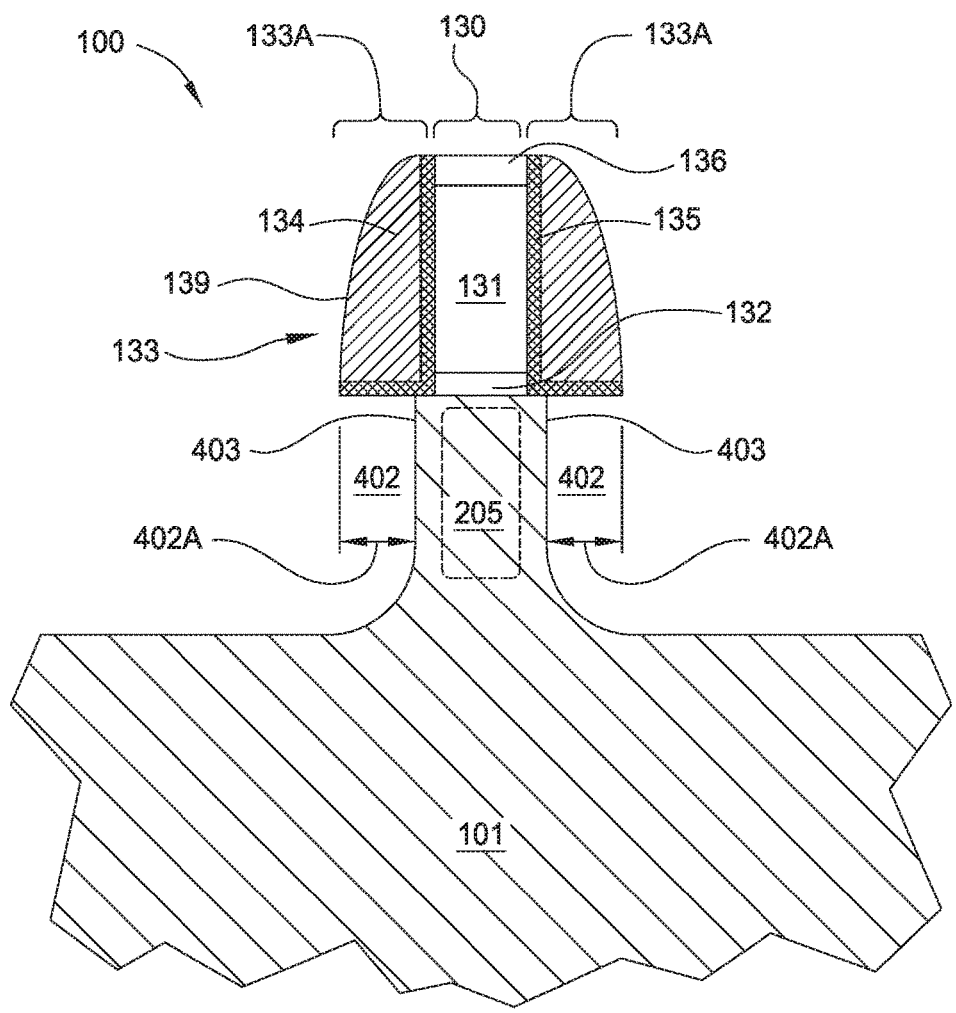

In operation 303, an isotropic etch process is performed on sidewall surface 401 to form one or more cavities 402 in the material of semiconductor fin 121, as illustrated in FIG. 4C. As shown, each cavity 402 has a surface 403. Furthermore, each cavity 402 is disposed between an existing structure of finFET 100 (i.e., one of gate spacers 133) and the bulk semiconductor portion of semiconductor substrate 101. Consequently, portions of cavities 402 are each in a region of semiconductor fin 121 that is inaccessible to a line-of-sight ion implantation technique.

The isotropic etch process of operation 303 may be selected to remove sufficient material from semiconductor fin 121 so that cavity 402 has any suitable target width 402A. For example, in some embodiments, the isotropic etch process of operation 303 is performed so that cavity 402 has a target width 402A of about 2 nm to about 10 nm. In other embodiments, sidewall surface 401 may have a target width 402A of more than 10 nm or less than 2 nm, depending on the geometry of gate spacers 133, the concentration of n-dopants or p-dopants in heavily doped regions 201, and other factors. For example, in some embodiments, target width 402A may be selected so that cavities 402 have a target width 402A of no more than about 1 nm less than width 133A of gate spacers 133.

The isotropic etch process of operation 303 may include any suitable etch process that is selective to the semiconductor material of semiconductor fin 121. For example, when semiconductor fin 121 includes silicon (Si), the isotropic etch process of operation 303 may include one or more of an HCl-based chemical vapor etch (CVE) process, an HCl- and GeH$_4$-based CVE process, and/or a Cl$_2$-based CVE process. In some embodiments the isotropic etch process of operation 303 comprises one or more of a wet etch process or a dry etch process. In some embodiments, the istropic etch process of operstion 303 comprises a dry etch process.

In some embodiments, an optional operation 304 is performed, in which a pre-deposition cleaning process or other surface preparation process is performed on surfaces 403 of cavities 402. The surface preparation process may be performed to remove native oxide on surface 403 and to otherwise prepare surface 403 prior to a (SEG) process performed in operation 305. The surface preparation process may include a dry etch process, a wet etch process, or a combination of both.

In such embodiments, the dry etch process may include a conventional plasma etch, or a remote plasma-assisted dry etch process, such as a SiCoNi™ etch process, available from Applied Materials, Inc., located in Santa Clara, Calif. In a SiCoNi™ etch process, surfaces 403 are exposed to H$_2$, NF$_3$, and/or NH$_3$ plasma species, e.g., plasma-excited hydrogen and fluorine species. For example, in some embodiments, surfaces 403 may undergo simultaneous exposure to H$_2$, NF$_3$, and NH$_3$ plasma. The SiCoNi™ etch process of operation 304 may be performed in a SiCoNi Preclean chamber, which may be integrated into one of a variety of multi-processing platforms, including the Centura™, Dual ACP, Producer™ GT, and Endura platform, available from Applied Materials. The wet etch process may include a hydrofluoric (HF) acid last process, i.e., the so-called "HF last" process, in which HF etching of surface 403 is performed that leaves surfaces 403 hydrogen-terminated. Alternatively, any other liquid-based pre-epitaxial pre-clean process may be employed in operation 304. In some embodiments, the process comprises a sublimation etch for native oxide removal. The etch process can be plasma or thermally based. The plasma processes can be any suitable plasma (e.g., conductively coupled plasma, inductively coupled plasma, microwave plasma).

In some embodiments, the apparatus or process tool is configured to maintain the substrate under vacuum conditions to prevent formation of an oxide layer and a pre-epitaxial pre-clean process is not used. In embodiments of this sort, the process tool is configured to move the substrate from an etch process chamber to an epitaxy chamber without exposing the substrate to atmospheric conditions.

Figure 4D:
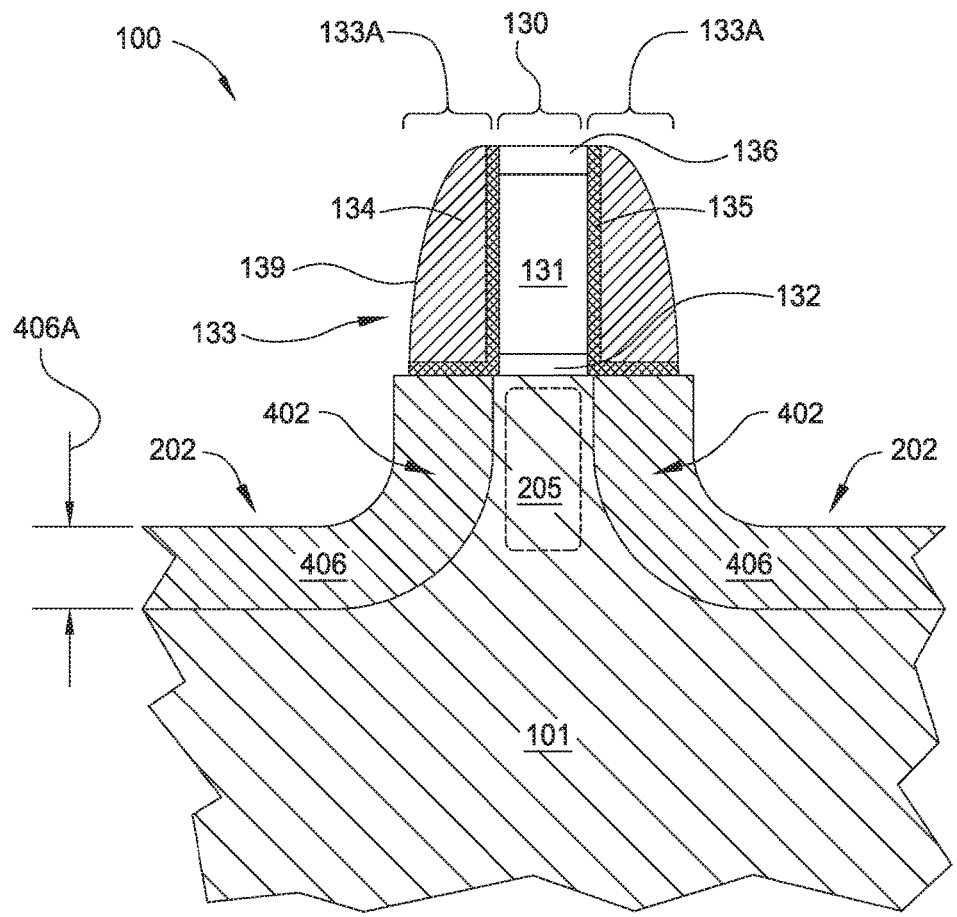

In operation 305, a selective epitaxial growth (SEG) process is performed on surfaces 403 to grow a layer of deposited material 406, thereby forming doped extension regions 202, as illustrated in FIG. 4D. Specifically, the deposited material includes a semiconductor material, such as silicon, and an n-type dopant. For example, in some embodiments, deposited material 406 includes Si:As, where the concentration of arsenic in deposited material 406 is selected based on the electrical requirements of finFET 100. It is noted that Si:As may be deposited via (SEG) with an electrically active dopant concentration of arsenic as high as about $5 \times 10^{21}$ atoms/cm$^3$. However, such high arsenic concentrations present in doped extension regions 202 can result in increases in resistivity due to the unwanted formation of As V (arsenic-vacancy) complexes, and arsenic diffusion into channel region 205. Furthermore, AsP V (arsenic-phosphorous-vacancy) complexes may be formed in doped extension regions 202, causing increased diffusion of phosphorus into channel region 205. Consequently, in some embodiments, deposited material 406 includes an electrically active dopant concentration of arsenic no greater than about $5\times 10^{20}$ atoms/cm$^3$.

In some embodiments, deposited material 406 may have a deposition thickness 406A of about 2 nm to about 10 nm. In other embodiments, deposited material 406 may have a deposition thickness 406A that is thicker than 10 nm for certain configurations of finFET 100. In some embodiments, deposition thickness 406A is selected so that deposited material 406 completely fills cavity 402, as shown in FIG. 4D. In other embodiments, deposition thickness 406A is selected so that deposited material 406 partially fills cavity 402, and covers the exposed surface of the semiconductor fin 121 that forms the cavity 402.

A suitable SEG process in operation 305 may include specific process temperatures and pressures, process gases, and gas flows that are selected to facilitate selective growth of a particular n-doped or p-doped semiconductor material. In embodiments in which the particular n-doped semiconductor material includes Si:As, a doping gas used in the SEG process of operation 305 may include AsH$_3$, As(SiH$_3$)$_3$, AsCl$_3$, or tertiarybutylarsine (TBA). Other gases employed in the SEG process may include dichlorosilane (DCS), HCl, SiH$_4$, Si$_2$H$_6$, and/or Si$_4$H$_{10}$. In such embodiments, the SEG process of operation 305 may be performed in an atmospheric pressure or high sub-atmospheric pressure chamber with low H$_2$ carrier gas flow. For example, in such embodiments the process pressure in the processing chamber performing the SEG process may be on the order of about 20-700 T. In such embodiments, the high reactor pressure and low dilution (due to low carrier gas flow) can yield high arsenic and high dichlorosilane (H$_2$SiCl$_2$ or DCS) partial pressures, thereby favoring removal of chlorine (Cl) and excess arsenic from surface 403 during the SEG process. Consequently, high film growth rate and associated high arsenic incorporation rates are realized, and good crystal quality can be achieved. In some embodiments, the doping gas used provides a p-doped semiconductor material. In some embodiments, the p-doped semiconductor material comprises one or more of boron (B), aluminum (Al), gallium (Ga) or indium (In). In some embodiments, the doping precursor comprises one or more of borane, diborane or plasmas thereof.

The SEG process of operation 305 may be performed in any suitable processing chamber, such as a processing chamber that is integrated into one of a variety of multi-processing platforms, including the Producer™ GT, Centura™ AP and Endura platform, available from Applied Materials. In such embodiments, the SiCoNi™ etch process of operation 304 may be performed in another chamber of the same multi-processing platform.

Figure 4E:
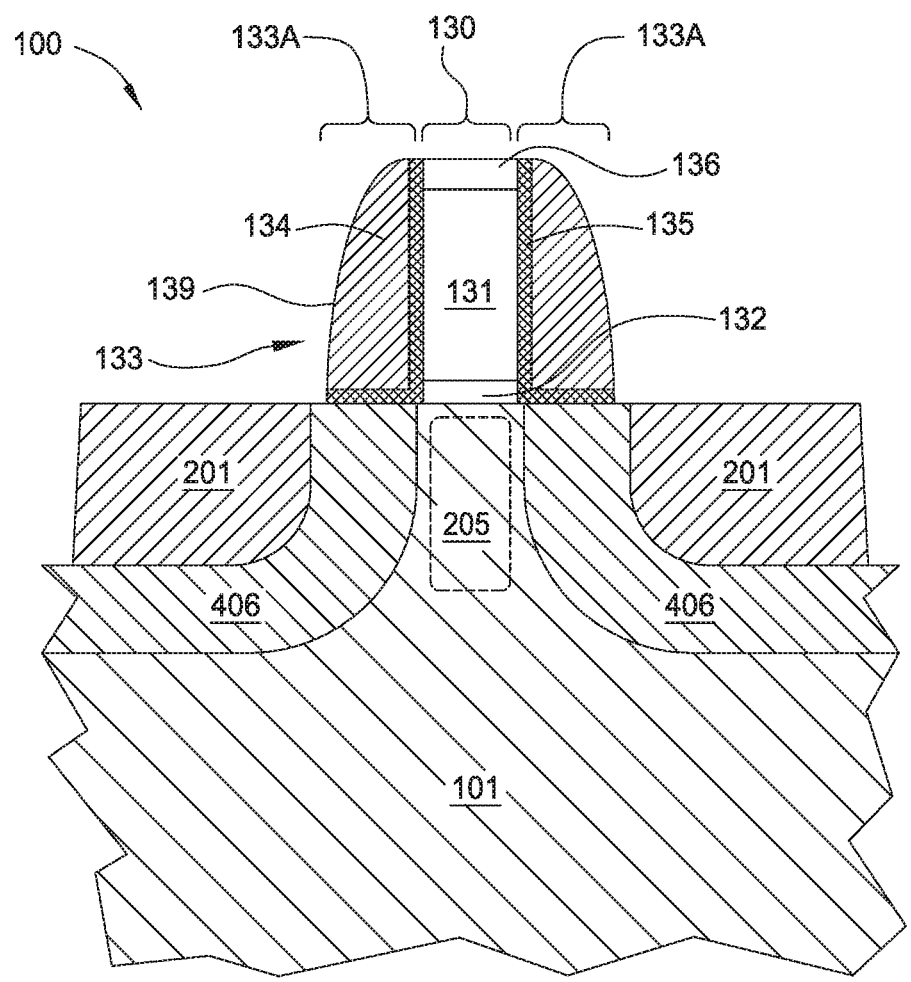

In operation 306, a second SEG process is performed, in which heavily doped regions 201 are formed, as illustrated in FIG. 4E. Heavily doped regions 201 are formed on doped extension regions 202. Heavily doped regions 201 may be formed of any suitable semiconductor material, including doped silicon, doped silicon germanium, doped silicon carbon, or the like. The dopant or dopants may include any suitable n-dopant, such as phosphorus. For example, in some embodiments, heavily doped regions 201 may include phosphorus-doped silicon (Si:P). Any suitable SEG process may be employed to form heavily doped regions 201. The thickness and other film characteristics of heavily doped regions 201 may be selected based on the electrical requirements of finFET 100, the size of finFET 100, and other factors.

In some embodiments, the second SEG process is performed in the same process chamber as the SEG process of operation 305. Thus, doped extension regions 202 may be formed in what is effectively a preliminary deposition step during the formation of heavily doped regions 201. Consequently, in such embodiments, no dedicated process chamber is needed to form doped extension regions 202, and additional time for transferring a substrate from a first process chamber (for performing SEG of doped extension regions 202) to a second process chamber (for performing SEG of heavily doped regions 201) is avoided. In addition, deposited material 406 is not exposed to air in such embodiments. Alternatively, in some embodiments, the second SEG process is performed in a different process chamber than the SEG process of operation 305, thereby reducing the number of process chambers that are exposed to hazardous dopants such as arsenic. In such embodiments, both chambers may be integrated into the same multi-processing platform, thereby avoiding a vacuum break and exposure of deposited material 406 to air.

After operation 306, remaining components of finFET 100 may be completed using conventional fabrication techniques.

Implementation of process 300 enables the formation of doped extension regions 202 in a precisely defined location, i.e., in a region of semiconductor fin 121 that is difficult to access with conventional ion implantation techniques. In addition, the process by which doped extension region 202 are formed can be incorporated into an existing selective epitaxial growth step already employed in the fabrication of a finFET, thereby minimizing or eliminating disruptions to the process flow for forming a finFET. Furthermore, implant damage, i.e., defects from heavy mass ion implantation such as silicon interstitials or even silicon amorphization, is avoided, as well as any deleterious interactions between such crystal defects and high concentrations of arsenic and/or phosphorus. Therefore, no post implant anneal or associated additional thermal budget affecting processes are needed. Also, when the SEG process of operation 305 is performed in the same process chamber as the SEG process of operation 306, or in different process chambers on the same multi-processing platform, additional pre-clean related material loss is also avoided, since no vacuum break occurs between deposition of doped extension regions 202 and heavily doped regions 201.

As is well-known in the art, the introduction of tensile strain into the channel region of an nMOS finFET can increase charge mobility in the nMOS finFET. Furthermore, formation of an epitaxially grown Si:As material adjacent to channel region 205 of semiconductor fin 121, as described herein, can introduce significant tensile strain in channel region 205. For example, according to some embodiments of the disclosure, n-doped extension regions can be deposited with an arsenic concentration sufficient to produce a targeted tensile strain within doped extension regions 202. Thus, in embodiments in which deposited material 406 includes epitaxially grown Si:As, an additional benefit of the formation of doped extension regions 202 in finFET 100 is that channel region 205 can have improved charge mobility as a result of tensile strain introduced therein by the formation of an n-doped extension regions. In some embodiments, germanium (Ge), antimony (Sb) and/or tin (Sn), for example, are doped into a p-doped extension region to provide compressive stress to the channel.

In some embodiments, an optional carbon-containing layer is formed in cavities 402. In such embodiments, the carbon-containing layer may be a liner between doped extension region 202 and heavily n-doped region 201. One such embodiment is illustrated in FIG. 5.

Figure 5:
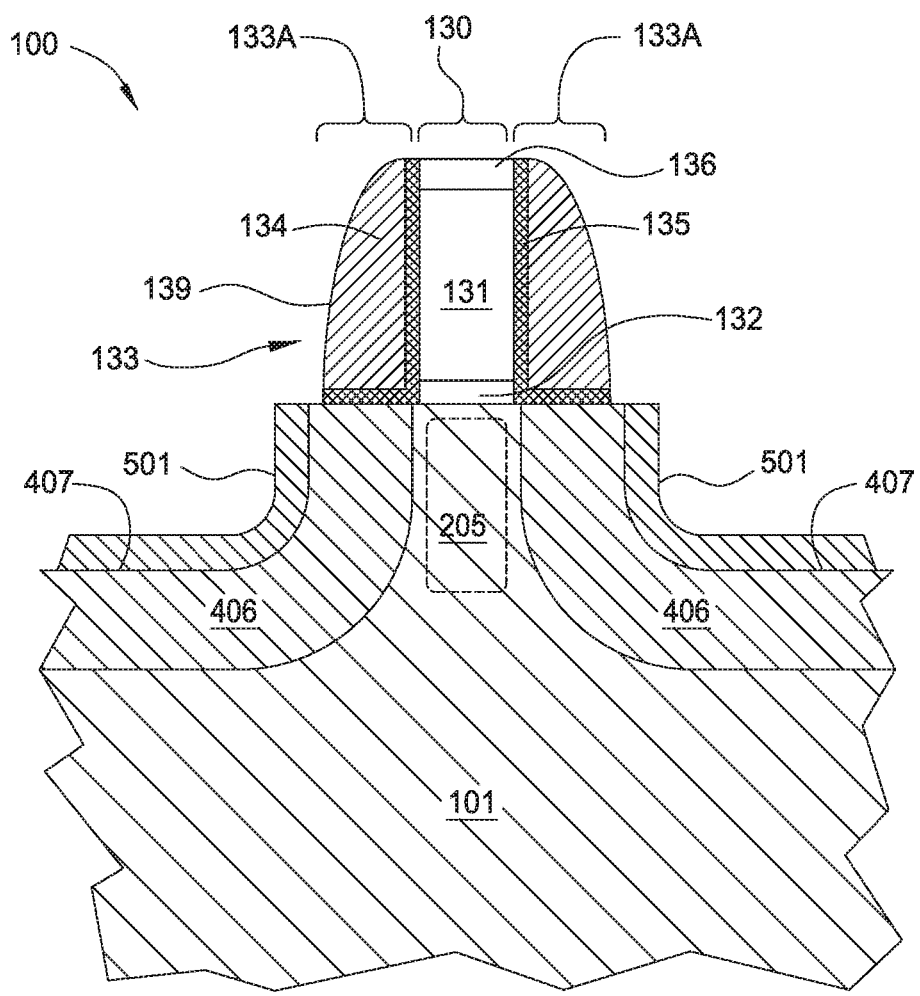
FIG. 5 is a schematic cross-sectional view of the finFET of FIG. 1 after formation of cavities, according to one or more embodiments of the disclosure.

FIG. 5 is a schematic cross-sectional view of finFET 100 after formation of cavities 402, according to various embodiments of the disclosure. As shown, a carbon-containing layer 501 is deposited on a surface 407 of deposited material 406. The presence of carbon (C) may enhance diffusion of arsenic while reducing the diffusion of phosphorus. Thus, in some embodiments, carbon-containing layer 501 includes between about 0.5% to about 1.0% carbon. In such embodiments, carbon-containing layer 501 may further include phosphorus, for example between about $1\times10^{20}$ atoms/cm$^3$ and about $5\times10^{20}$ atoms/cm$^3$. Such a carbon-containing layer may be grown in an atmospheric or near-atmospheric SEG chamber at a process temperature of about 650° C.±50° C. Thus, in embodiments in which carbon-containing layer 501 includes Si:C:P, a tri-layer structure is formed that includes Si:P (heavily n-doped region 201), Si:C:P (carbon-containing layer 501), and Si:As (doped extension regions 202). Such a tri-layer structure may cause diffusion of arsenic away from channel region 205, and towards heavily n-doped region 201.

In some embodiments, an n-doped semiconductor material may be formed as part of a nanowire structure in regions of the nanowire structure that are not accessible via conventional ion implantation techniques. The formation of one such embodiment is described below in conjunction with FIG. 6 and FIGS. 7A-7E.

Figure 6:
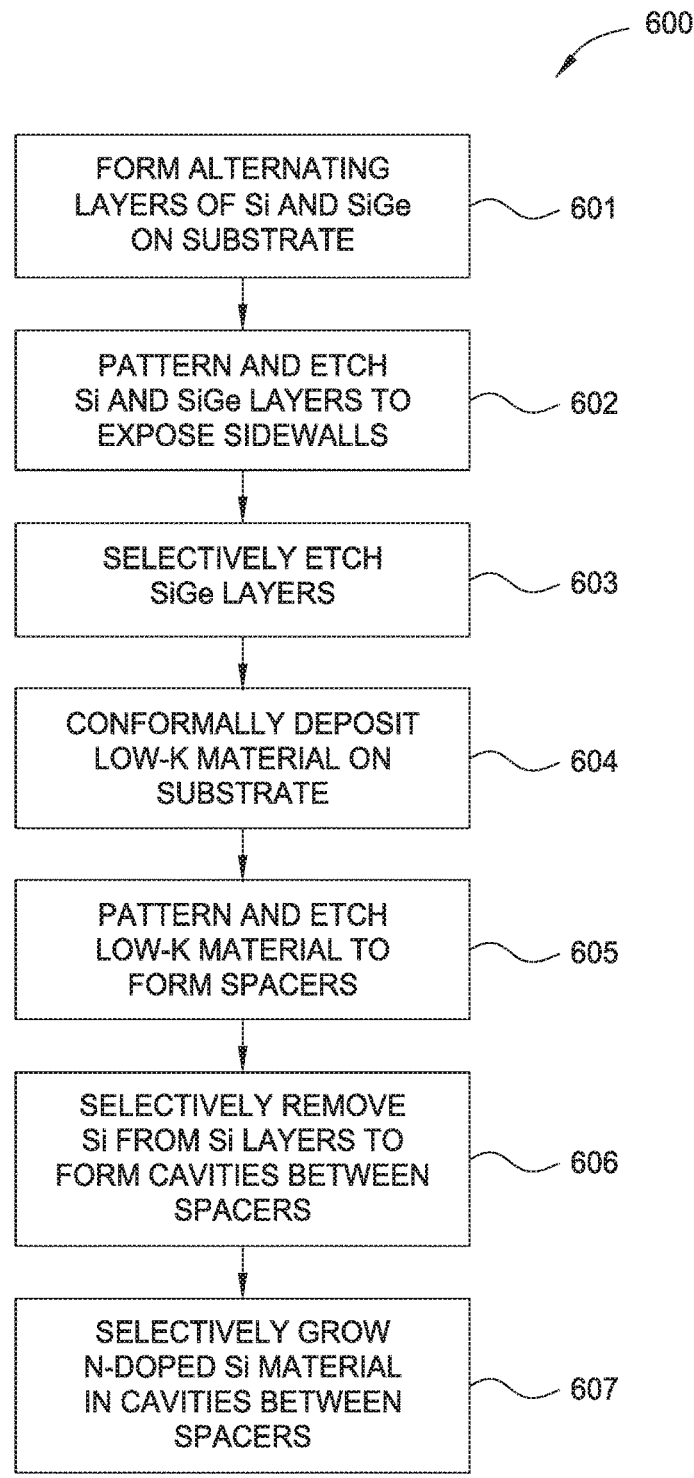
FIG. 6 is a flowchart of a manufacturing process for forming a nanowire structure, according to one or more embodiments of the disclosure.

FIG. 6 is a flowchart of a manufacturing process 600 for forming a nanowire structure 700, according to various embodiments of the disclosure. FIGS. 7A-7E are schematic cross-sectional views of the nanowire structure 700 corresponding to various stages of process 600, according to embodiments of the disclosure. Although process 600 is depicted for forming an n-doped region in a nanowire structure, process 600 may be employed to form other structures on a substrate as well.

Figure 7A:
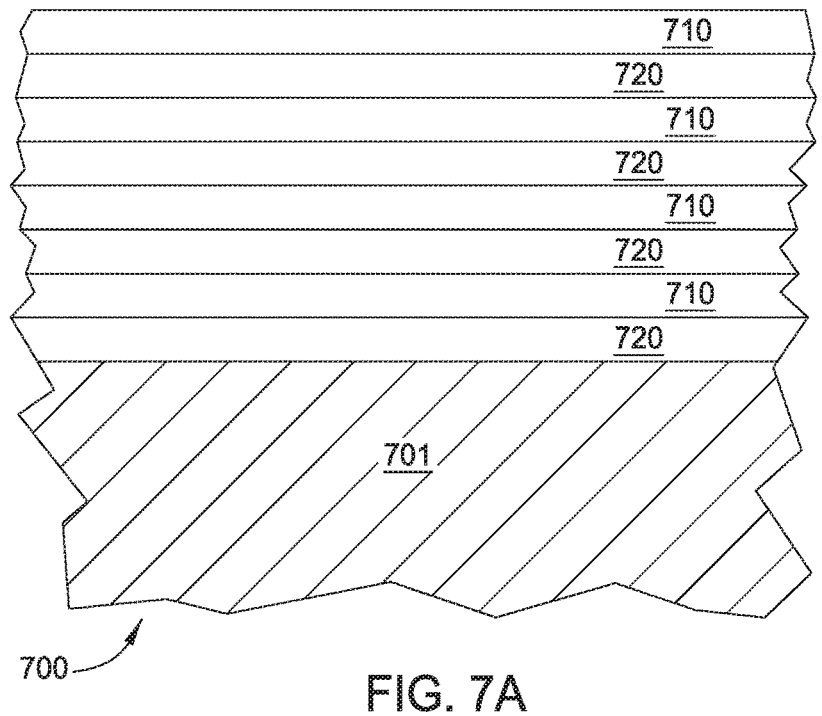
FIGS. 7A-7G are schematic cross-sectional views of the nanowire/nanosheet structure of FIG. 7 corresponding to various stages of the process of FIG. 6, according to one or more embodiments of the disclosure.

Process 600 begins at operation 601, in which alternating silicon layers 710 and silicon-germanium (SiGe) layers are formed on a bulk semiconductor substrate 701, as illustrated in FIG. 7A. Bulk semiconductor substrate 701 may be formed of silicon, silicon germanium, or any other suitable bulk crystalline semiconductor material. Silicon layers 710 and silicon-germanium layers 720 may each be formed via a SEG process, and typically include a crystalline semiconductor material.

Figure 7B:
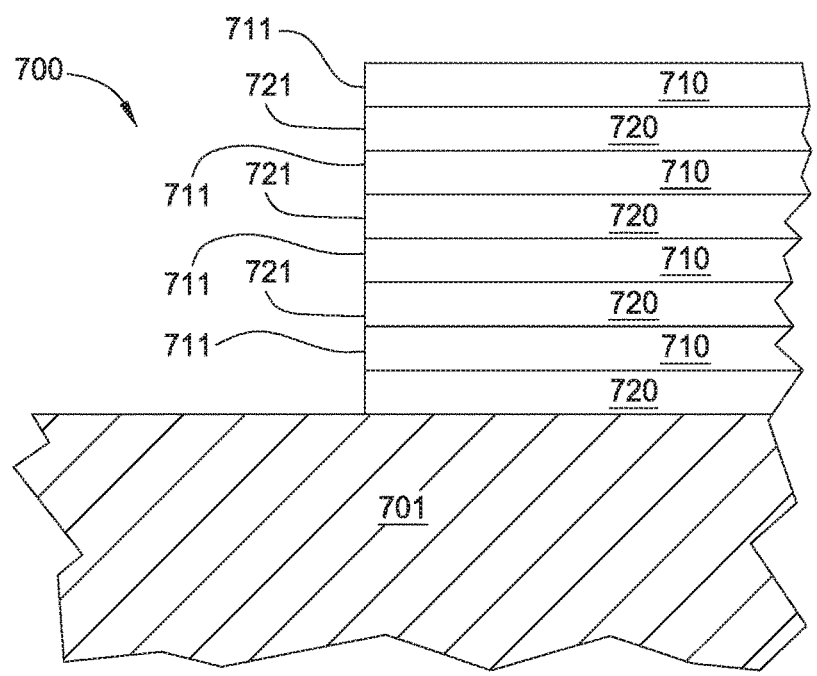

In operation 602, silicon layers 710 and silicon-germanium layers 720 are patterned and etched to expose vertical sidewalls 711 on silicon layers 710 and vertical sidewalls 721 on silicon-germanium layers 720, as illustrated in FIG. 7B. In some embodiments, operation 602 includes a DRIE process.

Figure 7C:
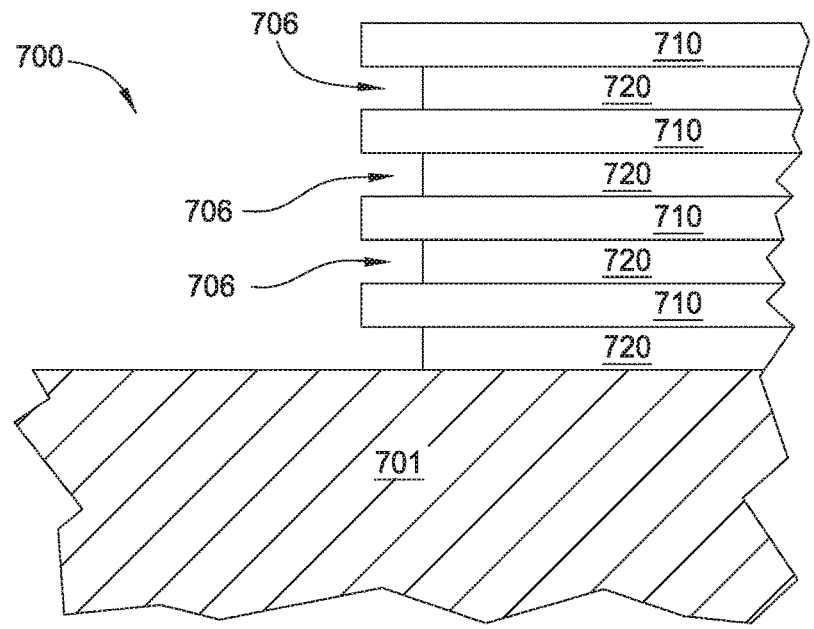

In operation 603, silicon-germanium layers 720 are selectively etched inward from vertical sidewalls 721, to form cavities 706, as illustrated in FIG. 7C. In some embodiments, a chemical vapor etching (CVE) process is used to selectively remove silicon-germanium layers 720 over silicon layers 710. For example, gaseous hydrochloric acid selective etching of SiGe versus Si in a reduced pressure-chemical vapor deposition reactor has been demonstrated. Alternatively, an ex-situ HF-dip followed by a GeH$_4$-enhanced Si etch that is performed in-situ in an epi reactor can be employed in operation 603.

Figure 7D:
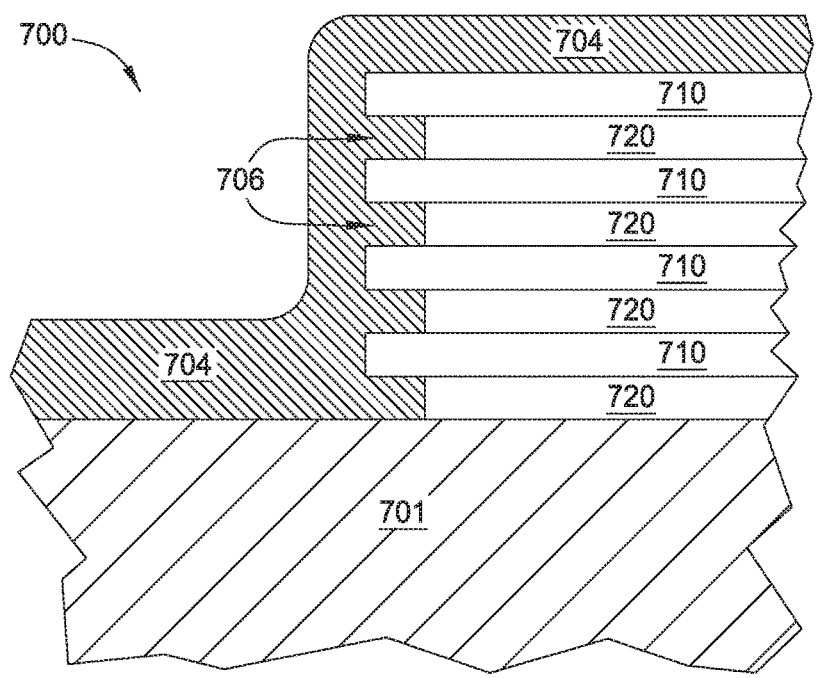

In operation 604, a low-k material 704 is then conformal deposited on bulk semiconductor substrate 701, as illustrated in FIG. 7D. Low-k material 704 fills at least a portion of cavities 706.

Figure 7E:
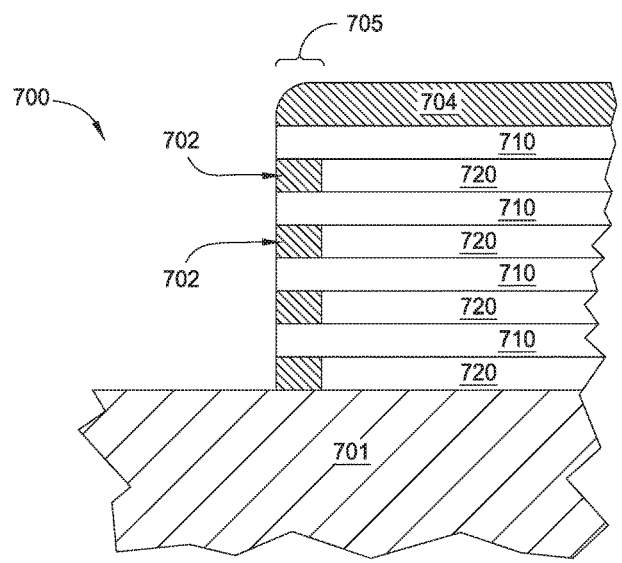

In operation 605, low-k material 704 is patterned and etched to expose vertical sidewalls 711 on silicon layers 710 and filled cavities 706 on silicon-germanium layers 720, as illustrated in FIG. 7E. In some embodiments, operation 605 includes a DRIE process. The filled cavities 706 form spacers 702, where each spacer 702 is formed at an edge region 705 of a silicon-germanium layer 720.

Figure 7F:
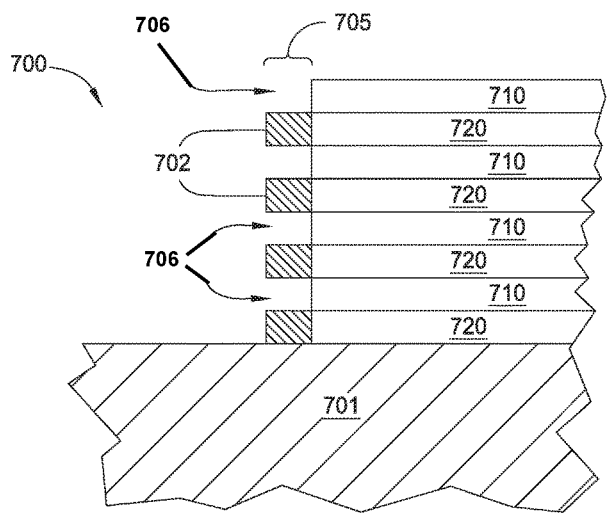

In operation 606, portions of silicon layers 710 are selectively removed from the edge regions 705 to form cavities 706, as shown in FIG. 7F. Silicon may be removed from edge regions 705 via a CVE process, such as a CVE process that is selective to silicon over spacers 702. In some embodiments, the CVE process may include one or more of an HCl-based CVE process, an HCl- and GeH$_4$-based CVE process, and/or a Cl$_2$-based CVE process.

Figure 7G:
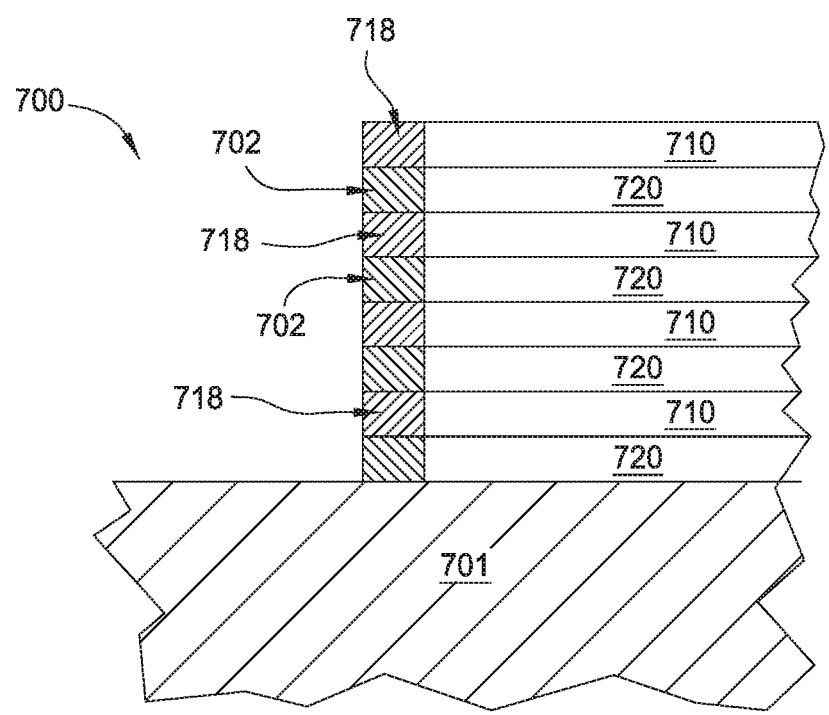

In operation 607, an n-doped silicon material 718 is grown in cavities 706 via a SEG process, as illustrated in FIG. 7G. In some embodiments, the n dopant is arsenic, and the n-doped silicon material includes Si:As. In such embodiments, the SEG process of operation 605 may be substantially similar to the SEG process of operation 305 in process 300, which is set forth above.

In alternative embodiments, spacers 702 may be formed by selectively oxidizing portions of silicon-germanium layers 720, rather than selectively etching portions of silicon-germanium layers 720 that are then filled with low-k material 704.

Implementation of process 600 enables the formation of nanowire structure 700 that includes doped regions, i.e., cavities 706 filled with n-doped silicon material 718. It is noted that the above-described doped regions are not accessible by line-of-sight ion implantation techniques, since cavities 706 are disposed between an existing structure of nanowire structure 700 and a bulk semiconductor portion of semiconductor substrate 701. Consequently, such doped regions cannot be formed via conventional techniques.

Figure 8:
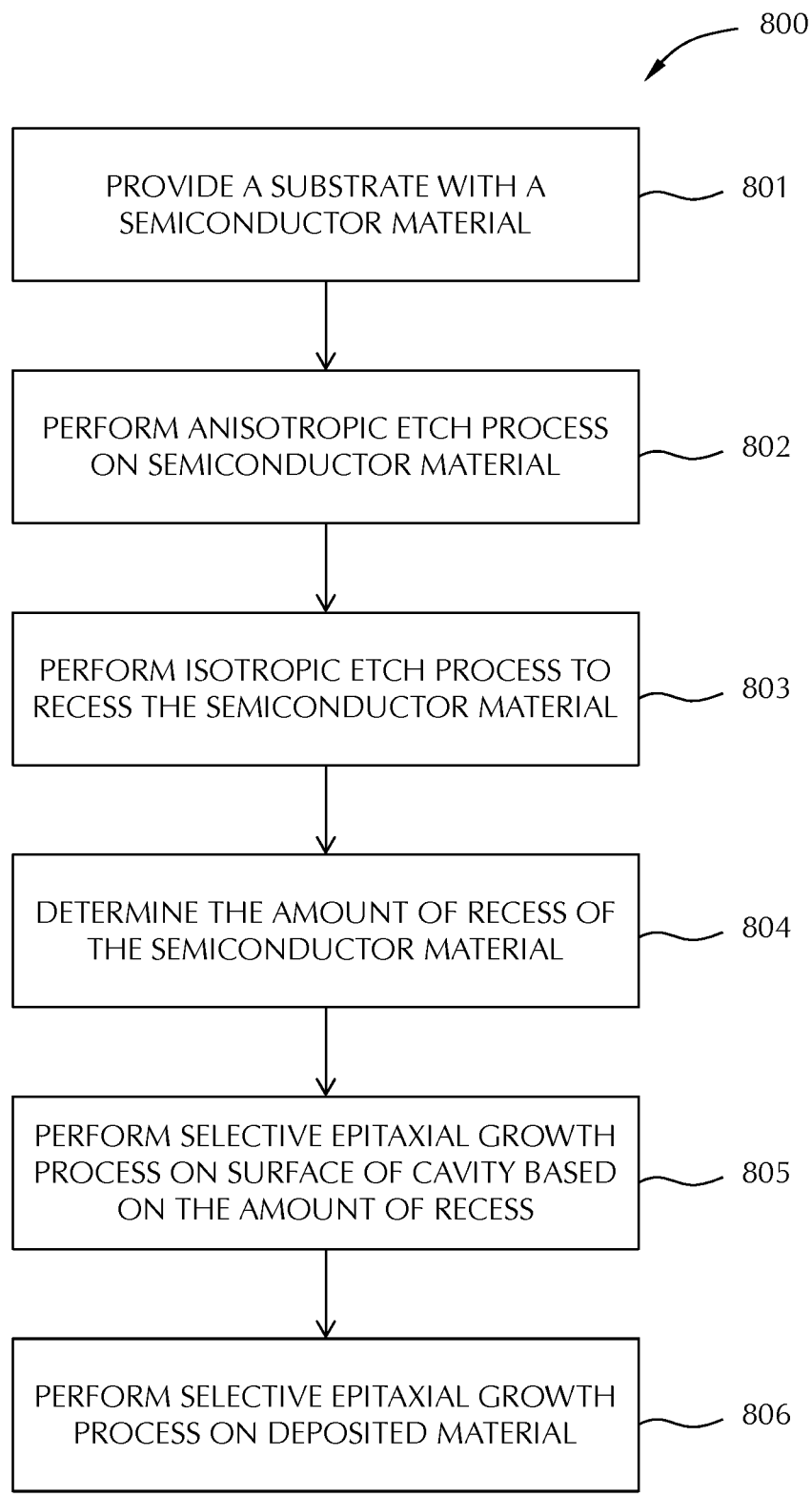
FIG. 8 is a flowchart of a manufacturing process for forming a semiconductor device according to one or more embodiment of the disclosure.

FIG. 8 illustrates another embodiment of the disclosure. The skilled artisan will recognize that the method 800 illustrated in FIG. 8 can be combined with process 300 or process 600. With reference to FIGS. 8 and 4A through 4E, method 800 begins at 801 where a semiconductor substrate is provided for processing. The semiconductor substrate has a semiconductor material thereon. As used in this specification and the appended claims, the term "provided" means that the substrate is placed into a position for processing. For example, the substrate may be placed within a first processing chamber for processing.

At operation 802, an anisotropic etch process is performed on the semiconductor material on a semiconductor substrate. The anisotropic etch process exposes a surface in the semiconductor material. In some embodiments, operation 802 is not performed. The exposed surface of some embodiments is disposed between an existing structure of the semiconductor device and a bulk semiconductor portion of the semiconductor substrate on which the semiconductor material is formed.

At operation 803, an isotropic etch process is performed on the exposed sidewall to recess the semiconductor material that is disposed between the existing structure and the bulk semiconductor portion of the substrate. The sidewall is recessed a distance to form a cavity. The amount that the sidewall is recessed can be varied based on, for example, the isotropic etch conditions.

At operation 804, the distance that the semiconductor material has been recessed by the isotropic etch process is determined. The recess distance can be measured by any suitable technique known to the skilled artisan. In some embodiments, the recess distance is determined by refractometry.

At operation 805, a layer of deposited material is formed via a selective epitaxial growth (SEG) process on the surface of the cavity. The substrate of some embodiments is not subjected to a pre-clean process between formation of the cavity and the SEG. In some embodiments, the substrate is not exposed to atmospheric conditions or oxidizing conditions between formation of the cavity and the SEG process.

The SEG process of some embodiments is adjusted from a predetermined method based on the distance of the recess. For example, if the predetermined method is configured for a recess depth of 5 Å and the actual measured recess depth is 6 Å, the SEG conditions can be altered to grow a sufficient film to make up for the difference. In some embodiments, the SEG process is adjusted to perform more than one type of growth. For example, if the recess depth is greater than a predetermined limit, the SEG process may begin by depositing silicon prior to formation of the doped deposited material.

In one or more embodiments, operation 803, operation 804, and operation 805 are integrated by using advanced process controls (APC). As used herein, the term "integrated" means that the lateral push and epitaxial growth are performed in the same platform (under vacuum processing). At operation 804, integrated metrology may be used to determine the amount of recess distance. In some embodiments, the integrated metrology is conducted in situ. Once the recess distance has been determined by integrated metrology, the measurements will be fed to the epitaxial tool so compensation can be performed (e.g. thickness/composition of first epitaxial layer can be adjusted accordingly). In some embodiments, advanced process controls comprise one or more of scatterometry (i.e., optical critical dimension (OCD) metrology), refractometry, ellipsometry or e-beam.

Figure 9:
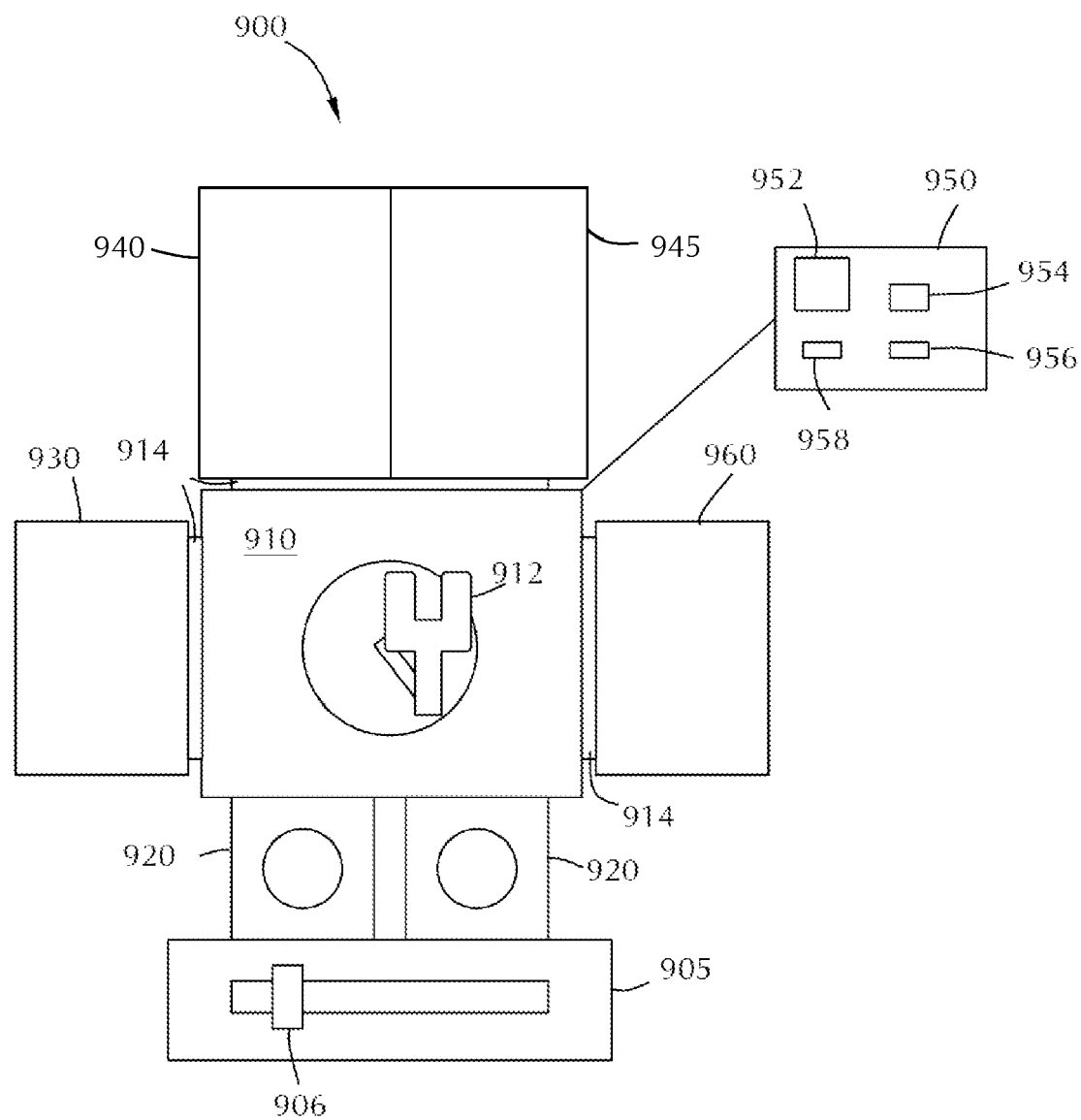
FIG. 9 shows a schematic view of a processing system to perform the methods of any of the embodiments of the disclosure.

With reference to FIG. 9, additional embodiments of the disclosure are directed to processing tools 900 for executing the methods described herein. FIG. 9 illustrates a system 900 that can be used to process a substrate according to one or more embodiment of the disclosure. The system 900 can be referred to as a cluster tool. The system 900 includes a central transfer station 910 with a robot 912 therein. The robot 912 is illustrated as a single blade robot; however, those skilled in the art will recognize that other robot 912 configurations are within the scope of the disclosure. The robot 912 is configured to move one or more substrate between chambers connected to the central transfer station 910.

At least one pre-clean/buffer chamber 920 is connected to the central transfer station 910. The pre-clean/buffer chamber 920 can include one or more of a heater, a radical source or plasma source. The pre-clean/buffer chamber 920 can be used as a holding area for an individual semiconductor substrate or for a cassette of wafers for processing. The pre-clean/buffer chamber 920 can perform pre-cleaning processes or can pre-heat the substrate for processing or can simply be a staging area for the process sequence. In some embodiments, there are two pre-clean/buffer chambers 920 connected to the central transfer station 910.

In the embodiment shown in FIG. 9, the pre-clean chambers 920 can act as pass through chambers between the factory interface 905 and the central transfer station 910. The factory interface 905 can include one or more robot 906 to move substrate from a cassette to the pre-clean/buffer chamber 920. The robot 912 can then move the substrate from the pre-clean/buffer chamber 920 to other chambers within the system 900.

A first processing chamber 930 can be connected to the central transfer station 910. The first processing chamber 930 can be configured as an anisotropic etching chamber and may be in fluid communication with one or more reactive gas sources to provide one or more flows of reactive gases to the first processing chamber 930. The substrate can be moved to and from the deposition chamber 930 by the robot 912 passing through isolation valve 914.

Processing chamber 940 can also be connected to the central transfer station 910. In some embodiments, processing chamber 940 comprises an isotropic etching chamber and is fluid communication with one or more reactive gas sources to provide flows of reactive gas to the processing chamber 940 to perform the isotropic etch process. The substrate can be moved to and from the deposition chamber 940 by robot 912 passing through isolation valve 914.

Processing chamber 945 can also be connected to the central transfer station 910. In some embodiments, the processing chamber 945 is the same type of processing chamber 940 configured to perform the same process as processing chamber 940. This arrangement might be useful where the process occurring in processing chamber 940 takes much longer than the process in processing chamber 930.

In some embodiments, processing chamber 960 is connected to the central transfer station 910 and is configured to act as a selective epitaxial growth chamber. The processing chamber 960 can be configured to perform one or more different epitaxial growth processes.

In some embodiments, the anisotropic etch process occurs in the same processing chamber as the isotropic etch process. In embodiments of this sort, the processing chamber 930 and processing chamber 960 can be configured to perform the etch processes on two substrates at the same time and processing chamber 940 and processing chamber 945 can be configured to perform the selective epitaxial growth processes.

In some embodiments, each of the processing chambers 930, 940, 945 and 960 are configured to perform different portions of the processing method. For example, processing chamber 930 may be configured to perform the anisotropic etch process, processing chamber 940 may be configured to perform the isotropic etch process, processing chamber 945 may be configured as a metrology station or to perform a first selective epitaxial growth process and processing chamber 960 may be configured to perform a second epitaxial growth process. The skilled artisan will recognize that the number and arrangement of individual processing chamber on the tool can be varied and that the embodiment illustrated in FIG. 9 is merely representative of one possible configuration.

In some embodiments, the processing system 900 includes one or more metrology stations. For example metrology stations can be located within pre-clean/buffer chamber 920, within the central transfer station 910 or within any of the individual processing chambers. The metrology station can be any position within the system 900 that allows the distance of the recess to be measured without exposing the substrate to an oxidizing environment.

At least one controller 950 is coupled to one or more of the central transfer station 910, the pre-clean/buffer chamber 920, processing chambers 930, 940, 945, or 960. In some embodiments, there are more than one controller 950 connected to the individual chambers or stations and a primary control processor is coupled to each of the separate processors to control the system 900. The controller 950 may be one of any form of general-purpose computer processor, microcontroller, microprocessor, etc., that can be used in an industrial setting for controlling various chambers and subprocessors.

The at least one controller 950 can have a processor 952, a memory 954 coupled to the processor 952, input/output devices 956 coupled to the processor 952, and support circuits 958 to communication between the different electronic components. The memory 954 can include one or more of transitory memory (e.g., random access memory) and non-transitory memory (e.g., storage).

The memory 954, or computer-readable medium, of the processor may be one or more of readily available memory such as random access memory (RAM), read-only memory (ROM), floppy disk, hard disk, or any other form of digital storage, local or remote. The memory 954 can retain an instruction set that is operable by the processor 952 to control parameters and components of the system 900. The support circuits 958 are coupled to the processor 952 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 950 has one or more configurations to execute individual processes or sub-processes to perform the method. The controller 950 can be connected to and configured to operate intermediate components to perform the functions of the methods. For example, the controller 950 can be connected to and configured to control one or more of gas valves, actuators, motors, slit valves, vacuum control, etc.

The controller 950 of some embodiments has one or more configurations selected from: a configuration to move a substrate on the robot between the plurality of processing chambers and metrology station; a configuration to perform an anisotropic etch process on a substrate; a configuration to perform an isotropic etch process on a substrate in a processing chamber; a configuration to perform an analysis to determine the recess of the semiconductor material in the metrology station; a configuration to perform a selective epitaxial growth process in an epitaxy chamber; a configuration to adjust the selective epitaxial growth process recipe to account for the recess of the semiconductor material; a configuration to perform a bulk selective epitaxial growth process; a configuration to load and/or unload substrates from the system.

In sum, one or more embodiments of the present disclosure provide systems and techniques for forming regions of doped semiconductor material that are disposed between an existing structure of a semiconductor device and a bulk semiconductor portion of the semiconductor substrate on which the doped silicon-containing material is formed. In embodiments in which the semiconductor device comprises a finFET device, the doped semiconductor material forms a doped source and/or drain extension disposed between a gate spacer of the finFET and a bulk semiconductor portion of the semiconductor substrate on which the doped source or drain extension is disposed.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a semiconductor device, the method comprising:
    performing an anisotropic etch process on a semiconductor material on a semiconductor substrate to expose a surface in the semiconductor material, the surface disposed between an existing structure of the semiconductor device and a bulk semiconductor portion of the semiconductor substrate on which the semiconductor material is formed;
    performing an isotropic etch process on an exposed sidewall to recess the semiconductor material that is disposed between the existing structure and the bulk semiconductor portion of the semiconductor substrate by a distance to form a cavity;
    in situ measuring the distance that the semiconductor material has been recessed after isotropic etch;
    forming a layer of deposited material via a selective epitaxial growth (SEG) process on a surface of the cavity, the substrate not subjected to a pre-clean process between formation of the cavity and SEG;
    adjusting the SEG process based on the distance that the semiconductor material has been recessed; and
    forming a doped region on the layer of deposited material via a selective epitaxial growth (SEG) process, wherein the doped region comprises one or more of phosphorus (P), arsenic (As), antimony (Sb), bismuth (Bi), lithium (Li), boron (B), aluminum (Al), gallium (Ga), and indium (In), the doped region having a dopant concentration in a range of about $1\times10^{20}$ atoms/cm$^3$ to about $1\times10^{22}$ atoms/cm$^3$,
    wherein the isotropic etch process, the SEG process, and the in situ measuring are performed in a single platform under vacuum processing.

2. The method of claim 1, wherein the isotropic etch occurs in a first process chamber and the method further comprises moving the substrate from the first process chamber to a second process chamber for the SEG process.

3. The method of claim 1, further comprising epitaxial growing a portion of the semiconductor material prior to forming the layer of deposited material.

4. The method of claim 1, wherein the distance that the semiconductor material has been recessed is measured by refractometry.

5. The method of claim 1, wherein the isotropic etch process comprises an etch process selective to the semiconductor material.

6. The method of claim 5, wherein the isotropic etch process comprises a chemical vapor etch process that includes exposing the exposed sidewall to at least one of HCl, $GeH_4$ or and $Cl_2$.

7. The method of claim 1, wherein forming the layer of deposited material comprises filling the cavity with the deposited material.

8. The method of claim 1, further comprising, prior to forming the layer of deposited material, depositing a carbon-containing material on the surface of the cavity, wherein the carbon-containing material includes a silicon-carbon-phosphorus (SiCP) material.

9. The method of claim 8, wherein the SiCP material includes in the range of about 0.1 to 2.0 atomic percent carbon and in the range of about about $1\times10^{20}$ atoms/cm$^3$ to $1\times10^{21}$ atoms/cm$^3$ phosphorus.

10. The method of claim 1, wherein performing the isotropic etch process on the exposed sidewall to form the cavity in the semiconductor material comprises removing semiconductor material until a portion of the semiconductor material that comprises a phosphorus-doped bulk semiconductor material is exposed.

11. The method of claim 1, wherein the deposited material comprises an n-type dopant comprising arsenic (As), and the selective epitaxial growth (SEG) process includes exposing the surface of the cavity to at least one of $AsCl_3$, TBA, or $AsH_3$ and at least one of dichlorosilane (DCS), HCl, $SiH_4$, $Si_2H_6$, or $Si_4H_{10}$.

12. The method of claim 11, wherein forming the layer of deposited material comprises filling the cavity with arsenic-doped material having an arsenic concentration sufficient to produce a targeted tensile strain within the deposited material.

13. The method of claim 1, wherein the deposited material comprises a p-type dopant comprising boron (B), and the selective epitaxial growth (SEG) process includes exposing the surface of the cavity to one or more of borane, diborane or plasmas thereof.

14. The method of claim 1, wherein the layer of additional deposited material is formed without exposing the layer of deposited material formed on the surface of the cavity to air.

* * * * *